United States Patent
Eskenas

(10) Patent No.: US 10,027,302 B2
(45) Date of Patent: Jul. 17, 2018

(54) AUDIO INTERRUPTER ALERTNESS DEVICE FOR HEADPHONES

(71) Applicant: Shari Eskenas, Redondo Beach, CA (US)

(72) Inventor: Shari Eskenas, Redondo Beach, CA (US)

( * ) Notice: Subject to any disclaimer, the term of this patent is extended or adjusted under 35 U.S.C. 154(b) by 0 days.

(21) Appl. No.: 14/706,872

(22) Filed: May 7, 2015

(65) Prior Publication Data

US 2016/0330538 A1    Nov. 10, 2016

(51) Int. Cl.
*H03G 3/20* (2006.01)
*H03G 3/32* (2006.01)
*G08B 3/00* (2006.01)
*H04R 3/12* (2006.01)
*H04R 1/10* (2006.01)

(52) U.S. Cl.
CPC ............. *H03G 3/32* (2013.01); *G08B 3/00* (2013.01); *H04R 3/12* (2013.01); *H04R 1/10* (2013.01); *H04R 2430/01* (2013.01)

(58) Field of Classification Search
CPC .... H04R 1/1041; H04R 2420/03; H04R 1/10; H04R 5/033; H04R 27/04; H04R 29/005; H04R 29/008; H04R 29/004; H04R 29/006; H04R 25/30; H04R 25/305; H04R 25/70; H03G 3/32; A61F 11/06; G10K 11/175
USPC ... 381/74, 72, 73.1, 309, 55, 56, 57, 59, 60, 381/111, 112, 113, 114, 115, 104, 107, 381/109, 110, 94.5, 120, 122, 123; 700/94; 340/540, 541, 565, 566, 692, 340/327, 384.73; 455/575.2, 569.1
See application file for complete search history.

(56) References Cited

U.S. PATENT DOCUMENTS 5,406,636 A * 4/1995 Yamada ................. H03F 1/305
381/104
5,473,702 A * 12/1995 Yoshida ................ H04R 3/005
381/94.6

(Continued)

FOREIGN PATENT DOCUMENTS

JP          11-041332 A  * 12/1999

*Primary Examiner* — Leshui Zhang
(74) *Attorney, Agent, or Firm* — Edwin Tarver

(57) ABSTRACT

The audio interrupter device (2) interfaces between any audio source (1) and headphones (3) to alert the user to external environmental sounds that exceed a threshold by temporarily halting audio transmission. The threshold is adjustable either through an automatic adjustment option that bases the threshold on the ambient sound level or through manual sensitivity adjustment. The device includes an audio plug (11) and an audio jack (12) that are connected to analog switches (10) that have the ability to connect and disconnect their corresponding conductors. An audio signal from a microphone (4) is amplified and input to a microcontroller (7), which compares the audio signal sample value to the sound interrupting threshold. If the audio signal sample exceeds the threshold, the analog switches disconnect the corresponding conductors of the audio plug and audio jack. If the audio signal sample is below the threshold, the analog switches connect the corresponding conductors of the audio plug and audio jack and thereby allow the audio signal to be transmitted from the audio source to the headphones.

3 Claims, 1 Drawing Sheet

(56) References Cited

U.S. PATENT DOCUMENTS

| | | | |
|---|---|---|---|
| 2009/0154726 A1* | 6/2009 | Taenzer | G10L 25/78 |
| | | | 381/94.1 |
| 2010/0189268 A1* | 7/2010 | Haartsen | A61B 5/6817 |
| | | | 381/56 |
| 2011/0158430 A1* | 6/2011 | Dicks | H03G 3/341 |
| | | | 381/104 |
| 2014/0270255 A1* | 9/2014 | Webb | H03G 7/002 |
| | | | 381/107 |
| 2015/0222977 A1* | 8/2015 | Angel, Jr. | H04R 1/105 |
| | | | 381/74 |

* cited by examiner

AUDIO INTERRUPTER ALERTNESS
DEVICE FOR HEADPHONES

BACKGROUND

People can be unaware of important sounds while they're listening to headphones. The drawback of an immersive headphone experience is the possibility of not being alerted to external sounds. This issue becomes especially problematic during the use of noise-cancelling headphones and high volume listening.

Common methods of environmental awareness for headphone users are to have a headphone over only one ear, to play audio at a low volume, or to use headphones that don't completely surround a user's ear.

Currently, the most applicable solution to this issue is presented in some phone apps. These phone apps interrupt audio transmitted to headphones when external sound exceeds a threshold. However, these apps are not portable and cannot be used in other audio devices such as laptops, stereo receivers, and MP3 players.

U.S. Pat. No. 4,250,499 issued to Kienzle proposes an alarm device that detects when sound is above a threshold and either disconnects earphones from an audio source and then connects the microphone to the earphones, or generates an output notification signal that connects to earphones. It proposes using a potentiometer to adjust the detection level threshold. U.S. Pat. No. 4,827,458 issued to D'Alayer de Costemore D'Arc proposes to alert the headphone user only for sounds that could possibly signal an abnormal event. External sound that is too brief or gradual would not be considered indicative of an abnormal event and the user would not be alerted. The user is either alerted by the audio signal transmission being attenuated or cutoff, or by an alert sound that is superimposed on the audio signal. A potentiometer is used to set the sensitivity of the system to sound surges and the characteristics resulting in an alert. It proposes the device to be small enough to easily incorporate into the listening device or audio source itself. It also proposes for the microphone to be mounted to the listening device or audio source. U.S. Pat. No. 8,194,865 issued to Goldstein et al. proposes a system that recognizes sound signatures and uses localization to identify pre-determined sounds of interest to the user. It proposes alerting the user to predetermined environmental sounds by different means including amplifying the environmental sound of interest, attenuating interfering environmental sound, reciting a pre-determined identifying label by means of a text-to-speech converter, rendering a sound pre-associated with the environmental sound, reciting localization information, and discontinuing playback of audio.

Although these references propose systems for providing notification of external events to headphone users, they do not provide a feature to automatically adjust the sound interrupting threshold based on the ambient sound level. These systems only propose manual sound interrupting threshold adjustments that require the user to gauge the ambient sound level. The limitations of these existing implementations and proposals necessitates a device that features both an option to automatically adjust the sound interrupting threshold based on ambient sound and compatibility with any audio source.

SUMMARY

The proposed audio interrupter is a small, compact device that interfaces between an audio source and headphones to momentarily stop sound transmission to alert the user of an external sound above a threshold. The sound interrupting threshold is adjustable either by means of manual sensitivity adjustment or by an automatic adjustment of the threshold that is based on the ambient sound level in the user's environment. It is a portable device that is compatible with any audio source and headphone.

Figure 1:
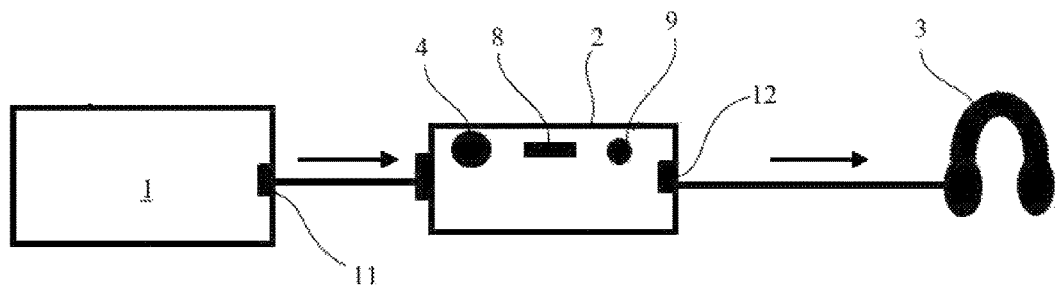
FIG. 1 shows how the audio source and headphones interface with the audio interrupter alertness device.

DRAWINGS—REFERENCE NUMERALS 1 any audio source
2 audio interrupter device
3 headphones
4 microphone
5 operational amplifier circuit
6 DC-DC converter
7 microcontroller
8 multi-position switch
9 tactile switch
10 analog switches
11 audio plug
12 audio jack
13 battery

DESCRIPTION

FIG. 1 shows the interface configuration of the audio interrupter alertness device 2 connected to an audio source 1 such as an MP3 player for example, and headphones 3. The audio interrupter 2 plugs into the audio source 1, and the headphones 3 plug into the audio interrupter 2. Thus, when a user listens to the headphones 3, a sound signal from the audio source 1 travels unimpeded through the audio interrupter 2 to the headphones 3 until interrupted by the audio interrupter 2. Various other examples of audio sources include but are not limited to a tablet, computer, phone, and stereo receiver.

Figure 2:
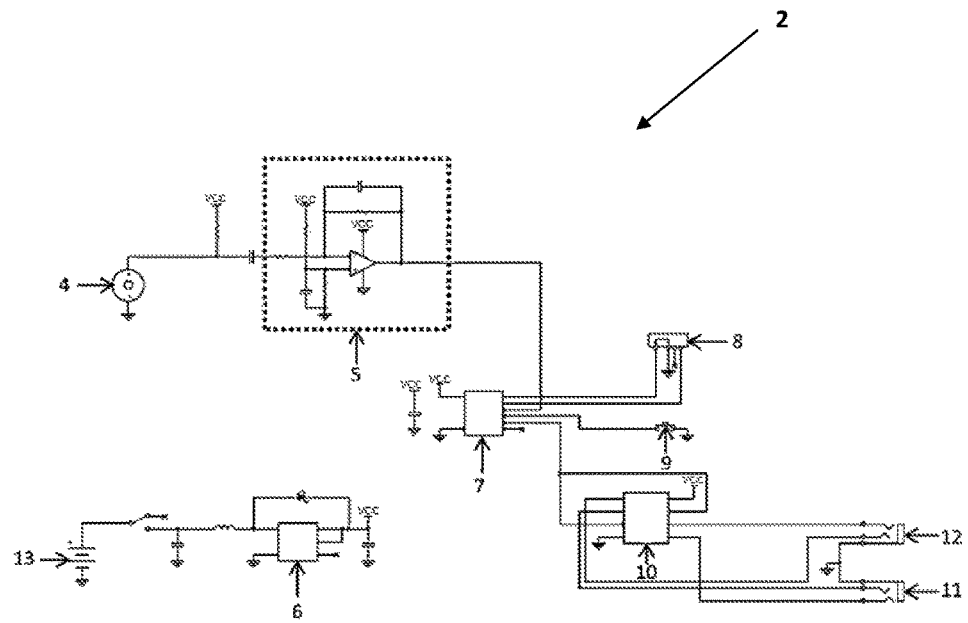
FIG. 2 represents the electronic circuitry of the audio interrupter alertness device.

In FIG. 2, the circuitry of the audio interrupter 2 is shown. A battery 13 is connected to the DC-DC converter 6, which steps up the battery voltage to a VCC level that is used by components of the circuit. The microphone 4 receives external sound pressure (i.e., sound produced in the ambient environment, not from the audio source 1), converts it into an electrical analog audio signal and transmits it to the operational amplifier circuit 5, where the analog audio signal is received and amplified. The analog audio signal is output from the operational amplifier circuit 5 and received by the microcontroller 7.

The microcontroller 7 includes an analog to digital converter that converts samples of the analog audio signal into digital values. The microcontroller 7 has been programmed to compare the digital values to a threshold value already stored in the microcontroller 7. If the digital value is below the threshold, the microcontroller 7 outputs a low voltage on one of its pins. If the digital value is above the threshold value, the microcontroller 7 outputs a high voltage on one of its pins. This output voltage (low or high) from the microcontroller 7 is input to a plurality of analog switches 10.

If the microcontroller 7 output voltage is low, the analog switches 10 remain closed, thereby allowing sound from the audio source 1 to travel unimpeded through the audio interrupter 2 and to the headphones 3 for listening. If the microcontroller 7 output voltage is high, the analog switches 10 are open for a short time interval. An audio plug 11 connecting the audio source 1 to the audio interrupter 2, and an audio jack 12 connecting the audio interrupter 2 to the headphones 3 are connected to the analog switches 10 in a configuration that connects their corresponding conductors. Therefore, the connection between the audio source 1 and the headphones 3 is open (i.e., interrupted) when the analog switches 10 are temporarily open. Alternatively, the connection between the audio source 1 and the headphones 3 is closed (i.e., not-interrupted) when the analog switches 10 are closed.

When the multi-position switch 8 is moved, the sound interrupting threshold in the microcontroller 7 changes by means of its programming to raise or lower the threshold value manually. Alternatively, when the tactile switch 9 is pressed, new samples of the analog audio signal coming from the microphone 4 are taken and averaged in the microcontroller 7 to produce a new sound interrupting threshold.

The existing patents for similar audio interrupting devices for headphones do not propose an automatic sound interrupting threshold adjustment based on using a tactile switch to cause the microcontroller 7 to re-sample sound from the ambient environment with the microphone 7 to produce a new threshold value for triggering sound interruption. The existing phone apps that interrupt audio to headphones do not allow for compatibility with all audio sources. The present audio interrupting device provides the option of automatic and manual adjustment of the sound interrupting threshold based on the ambient sound level by providing a multi-position switch 8 and a tactile switch 9. In addition to compatibility, it also presents a portable device that can be interfaced with any audio source.

I claim:

1. A compact audio interrupter device connected between an audio source and headphones for use in an ambient environment, the compact audio interrupter device comprising:

an audio plug for connection to the audio source and an audio jack for connection to the headphones;
an operational amplifier circuit;
a microphone in communication with an operational amplifier circuit, the microphone configured to transmit sound signals from the ambient environment into the operational amplifier circuit;
a microcontroller configured to receive the amplified sound signals from the operational amplifier circuit;
the microcontroller comprising an analog to digital converter configured to convert a sample of the audio signal sample coming from the microphone into the operational amplifier circuit, and into the microcontroller, thereby converting the sample into a digital value derived from the sound signals from the ambient environment;
the microcontroller programmed to compare the digital value to a threshold value stored in the microcontroller;
the microcontroller further programmed to output a low voltage if the digital value is below the threshold value, and to output a high voltage if the digital value is above the threshold value;
a plurality of analog switches individually connected to the audio plug for connection to the audio source, and the audio jack for connection to the headphones, wherein each of the plurality of analog switches is configured to be in a temporarily open or closed setting;
wherein each of the plurality of analog switches is further configured to be closed upon receiving the low voltage from the microcontroller, and configured to be open while receiving the high voltage;
the microcontroller further configured to convert a second audio signal sample from the operational amplifier circuit into a second digital value upon activation of a tactile switch to calculate a new threshold value, thereby allowing a user to periodically re-establish the new threshold value based on new samples of ambient sound.

2. The compact audio interrupter device of claim 1 further comprising a battery connected to a DC-DC converter configured to step up the battery voltage to a VCC level used by the microcontroller and the plurality of analog switches.

3. The compact audio interrupter device of claim 1 further comprising a multi-position switch configured to change the new threshold value when the multi-position switch is moved.

* * * * *